United States Patent
Moyal (10) Patent No.: US 6,667,642 B1
(45) Date of Patent: Dec. 23, 2003

(54) METHOD AND CIRCUIT FOR REDUCING THE POWER UP TIME OF A PHASE LOCK LOOP

(75) Inventor: Nathan Moyal, Austin, TX (US)

(73) Assignee: Cypress Semicondutor Corporation, San Jose, CA (US)

(*) Notice: Subject to any disclaimer, the term of this patent is extended or adjusted under 35 U.S.C. 154(b) by 0 days.

(21) Appl. No.: 10/247,235

(22) Filed: Sep. 18, 2002

(51) Int. Cl.[7] ................................................. H03L 7/06
(52) U.S. Cl. ........................................ 327/156; 327/143
(58) Field of Search .................................. 327/142, 143, 327/156–159; 331/DIG. 2; 375/376

(56) References Cited

U.S. PATENT DOCUMENTS 6,259,288 B1 * 7/2001 Nishimura .................. 327/156

* cited by examiner

Primary Examiner—Kenneth B Wells
(74) Attorney, Agent, or Firm—Wagner, Murabito & Hao LLP (57) ABSTRACT

A method and circuit for reducing the power up time of a phase lock loop (PLL). In one embodiment, the present invention cuts off a first voltage to the phase lock loop thereby powering down the phase lock loop. In power down, a second voltage is utilized to maintain the power requirements of the filter node within the phase lock loop while the other components of the phase lock loop are powered down. The PLL is now in a power down mode. The present invention then restores the first voltage to the PLL. Once the internal components of the PLL stabilize, the second voltage is disengaged from the filter node wherein the phase lock loop is powered up to operational power.

20 Claims, 6 Drawing Sheets

METHOD AND CIRCUIT FOR REDUCING THE POWER UP TIME OF A PHASE LOCK LOOP

FIELD OF THE INVENTION

The present invention relates to the field of phase lock loops. Specifically, the present invention relates to a method for reducing the power up time of a phase lock loop.

BACKGROUND ART

A phase lock loop (PLL) circuit is a circuit that is used for the synchronization of signals or for multiplying or dividing an input clock signal. For example, PLLs can function as synchronizing circuits in which an output frequency is synchronized or locked to a reference frequency. PLLs are used in a wide variety of electronic circuits where signals containing analog and digital information are decoded. They may be used in optical tachometers, motor control, television receivers, disk drives, modems, radios, and many other fields. PLLs may also be used in mobile communication applications related to such purposes as frequency generation, signal modulation and demodulation, and data decoding and encoding.

PLLs are unsynchronized when they have no reference signal. In this condition the PLLs are said to be unlocked or out of lock. PLLs generally work by comparing an input or a reference frequency to a generated output frequency and adjusting the output frequency to match the reference frequency. As the output signal is adjusted by the loop there occurs a point at which the frequencies of the output and reference signals match. At this point the signals are sometimes said to be in frequency lock. When the generated frequency is further synchronized in phase with the input frequency the condition is often referred to as phase lock, the locked state, or simply lock. During lock, when the output frequency is synchronized with the reference frequency, the phase error between the output frequency and reference frequency may be very small or even zero. In the lock state, the output signal will generally stay in lock until the phase lock loop is somehow perturbed. Some common factors that perturb phase lock loops are loss of the reference frequency, a change in the frequency or phase of the reference frequency, noise on the reference frequency, or noise in the system which disturbs the loop.

Figure 1:
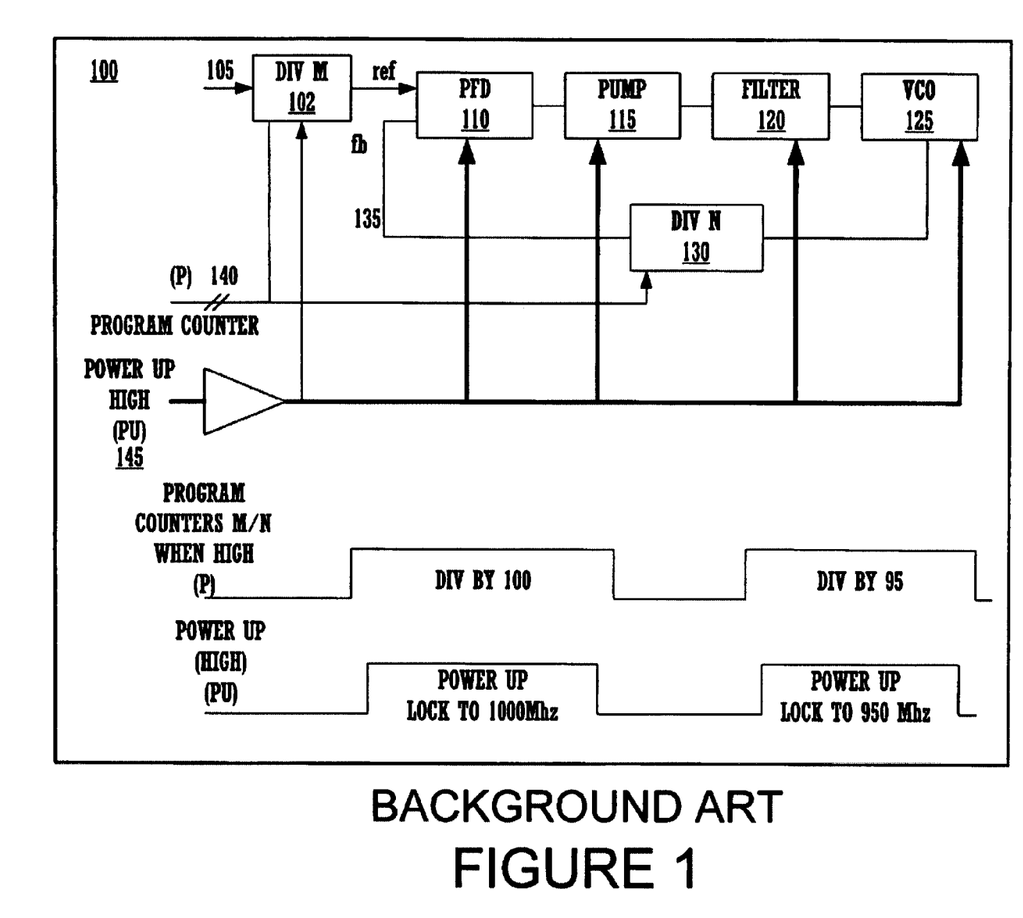
FIG. 1 is a block diagram of a conventional phase lock loop.

As shown in background art FIG. 1, a PLL 100 may include a voltage controlled oscillator (VCO) 125 and a reference clock input signal 105. The PLL is completed by feeding back the output of VCO 125 to a phase/frequency detector (PFD) 110 which also receives the reference clock signal 105. More particularly, clock 101 is provided to a divider circuit 102 which divides the clock signal by a value of N. The output of the divider 102 is reference clock signal 105 and is provided as one input to the phase/frequency detector 110. The output of the phase/frequency detector 110 is provided to a charge pump 115 which in turn provides an output to a filter 120. The voltage output of filter 120 is provided to VCO 125 which converts the voltage output of filter 120 to a frequency. The output of the VCO 125 may be provided as an output clock and also utilized in a feedback loop which is provided to divider 130 which divides the output by N. The output of divider 130 is then provided as the second input to phase/frequency detector 110. The M and N values may be called the PLL loop divisors. Therefore, in order to lock to a new frequency, the divide ratio of the loop divisors is changed.

The PLL has found extensive use in mobile communication circuits such as portable telephones. They are used to lock to transmitting and receiving frequencies and to recover clock signals from different digital data formats such as return to zero (RZ) and non return to zero (NRZ). For example, RF radio requires locking to new frequency channels (frequency hopping). Specifically, frequency hopping may be utilized to ensure that interference between communications devices is minimized. That is, if two or more devices are broadcasting on the same frequency destructive interference may occur which may result in a loss of some or all data being broadcast. Therefore, by "hopping" through many frequencies the probability of running into another device operating on the same frequency is limited. In addition, any encounter with another device operating on the same frequency will only occur until the next "hop."

One problem with the PLL is power consumption. Specifically, in a communications device, especially a mobile communications device relying on a battery source, an operational PLL has a large energy requirement and may consume a large portion of the power supplied by the battery. Therefore, several approaches have been used to minimize the rate of power consumption by these mobile communications devices in general, and the PLL in particular.

One approach for minimizing the power draw of the PLL is to enable operation of PLL circuitry only part of the time instead of continuously. For example, as shown in FIG. 1, between locks, the power source (e.g., PUI 145) driving the PLL may be powered down. The length of time of the power down depends on the package being utilized. For example, if a keyboard or mouse is being used to send wireless information, the power down time may be until the next set of information is ready to be sent. Then, when a frequency "hop" is required, the power up signal utilizes PUI 145 to reestablish the operation of the components within PLL 100.

However, the timeframe for powering up and stabilizing the PLL is extremely crucial to PLL re-activation due to the short lock time specification. One deleterious effect of powering up the PLL is that during power up the logic may transfer faulty pump signals. For example, the transfer of faulty pump signals may result in the components within the PLL sending incorrect information regarding frequency adjustment direction, such as sending an increase frequency signal instead of a decrease frequency signal.

In one conventional approach, the PLL is reactivated from a complete power down state and a constant period of time is waited before power is returned to all components so that all internal signals stabilize before the PLL is functional. This approach is disadvantageous because too much time is lost waiting for signal stabilization. In another approach, an advanced signal powers up the PLL before it is actually needed. This approach consumes too much power for battery operated devices.

In each of these approaches, power-up simulations are utilized to set up the time needed for reactivation. However, modeling error, simulation error, and/or unpredictable delay errors may cause the circuit to fail.

SUMMARY OF INVENTION

Thus, a need exists for a method for reducing the power up time of a phase lock loop (PLL). A further need exists for a method for reducing the power up time of a PLL which can efficiently reduce power consumption of the PLL. A further need exists for a method for reducing the power up time of a PLL which allows no information to be sent while powering up the PLL until the components within the PLL are stabilized. Still another need exists for a method for reducing the power up time of a PLL which is compatible with existing PLL processes.

A method and circuit for reducing the power up time of a phase lock loop is disclosed. In one embodiment, the present invention cuts off a first voltage to the phase lock loop thereby powering down the phase lock loop. In power down, a second voltage is utilized to maintain the power requirements of the filter node within the phase lock loop while the phase lock loop is otherwise powered down. The PLL is now in an energy conservation mode. The present invention then restores the first voltage to the phase lock loop. A period is waited until the internal components of the PLL stabilize and then the second voltage is disengaged from the filter node wherein the phase lock loop is powered up to operational power.

The present invention provides, in various embodiments, methods for reducing the power up time of a phase lock loop (PLL). Embodiments of the present invention also provide a method for reducing the power up time of a PLL which can efficiently reduce power consumption of the PLL. The present invention further provides a method for reducing the power up time of a PLL which allows no information to be sent while powering up the PLL until the components within the PLL are stabilized. The present invention also provides a method for reducing the power up time of a PLL which is compatible with existing PLL processes. The present invention further provides a method that can be integrated into a design or work with an existing PLL (e.g., modular).

More specifically, in one embodiment, upon PLL power down, the filter node is maintained with a reference voltage. Upon power up, a new frequency is programmed into the PLL. A start signal is then given which powers up the remaining circuits of the PLL, except for the filter node. After a first duration, the reference voltage is disengaged from the filter node. The first duration can be measured based on a predetermined time period obtained, for instance, from trial and error or by a simulation. Alternatively, the first duration could be measured by a signal that indicates that the other circuits are powered up. After the reference voltage is removed, the PLL is operational.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Reference will now be made in detail to embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Figure 2:
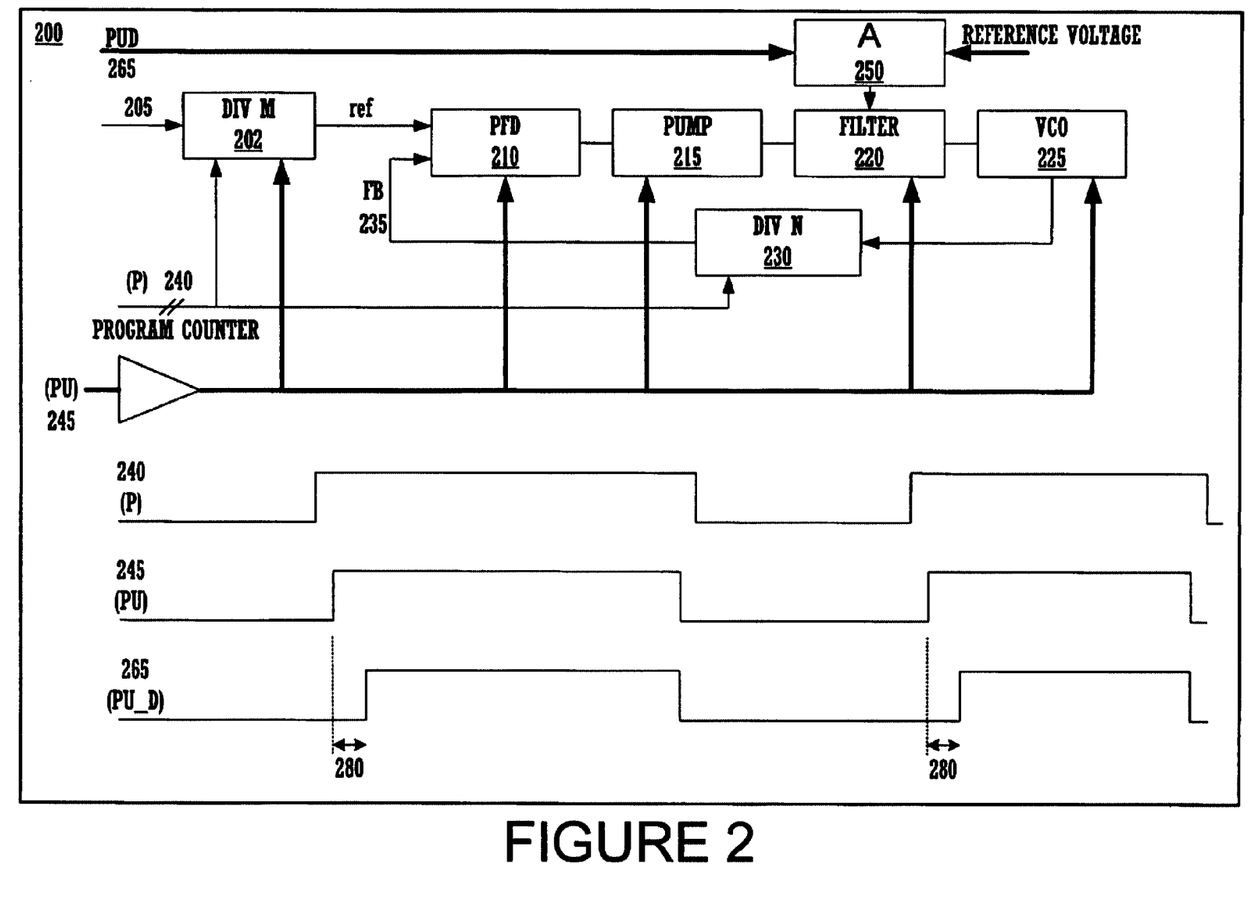
FIG. 2 is a block diagram and timing chart of an exemplary phase lock loop in accordance with one embodiment of the present invention.

With reference now to FIG. 2, an exemplary phase lock loop (PLL) circuit 200 is shown in accordance with one embodiment of the present invention. PLL 200 is comprised of a phase frequency detector (PFD) node 210, a pump node 215, a filter node 220, a voltage controlled oscillator (VCO) node 225, divider node 230, divider node 202, main power source 245 supplying power to PLL 200, and a reference voltage 265 for supplying power to filter node 220.

In general, PFD node 210 is used for comparing a reference clock frequency 205 with a feedback frequency 235. More particularly, reference clock 205 may be provided to divider 202 which divides the reference clock by a value of M, and the output of divider 202 is supplied to PFD node 210. Pump node 215 receives the comparing of the reference clock frequency 205 and the feedback frequency 235 from PFD node 210 and establishes a pump-up or pump-down signal based on the results of the comparing. Filter node 220 converts the pump-up or pump-down signal from pump node 215 to a voltage. VCO node 225 converts the voltage from filter node 220 into a frequency. Divider node 230 receives the adjusted frequency from VCO node 225 and divides it down by N into feedback frequency 235 for comparison with reference frequency 205 by PFD node 210. In one embodiment, reference voltage 265 may be independent of a main power source (e.g., power up high (PUI) 245) utilized by PLL 200 and will supply power to filter node 220 during a portion of the power down period of PLL 200. In another embodiment, reference voltage 265 may be a branch of the main power source (e.g., power up high (PUI) 245) utilized by PLL 200 to supply power to filter node 220 during a portion of the power shunting period of PLL 200.

With reference to the timing diagram of FIG. 2, one embodiment of the operation of a power down and power up cycle of PLL 200 is shown. Initially, when PLL 200 is operational, a global clock, such as reference clock 201 sends an electronic pulse (actually, a series of pulses) for PLL 200 to utilize while establishing frequency lock. In one embodiment, reference clock 201 is a crystal oscillator. During the operation of locking to a new frequency, PUI 245 is supplying full power to PLL 200. Once PLL 200 establishes a frequency lock and is no longer necessary, the supply of power from PUI 245 may be stopped and PLL 200 may enter a powered down mode (or power down period) to save energy. During the power down period, PFD node 210, pump node 215, and VCO node 225 receive no power from PUI 245. In another embodiment, during the power down period any or all of the nodes (e.g., PFD node 210, pump node 215, and VCO node 225) receive no power from PUI 245. In yet another embodiment, during the power down period only one of the nodes (e.g., PFD node 210, pump node 215, and VCO node 225) receives no power from PUI 245.

However, during the power down period, reference voltage 265 will be supplied to filter node 220 in accordance with embodiments of the present invention. For example, if the PLL operates at 2 volts, then during the power down period reference voltage 265 may supply 2 volts to filter node 220. In one embodiment, reference voltage 265 will be constantly supplied to filter node 220. In another embodiment, reference voltage 265 will be supplied to filter node 220 only at the end of the power down period. In addition, although the present example states that reference voltage 265 is the same as PUI 245, the present invention is well suited to a reference voltage 265 which is different from PUI 245 (e.g., 7/8, 3/4 of the power, etc.). According to PLL 200, the filter nodes remain powered up because these elements, e.g., capacitors, resistors, etc., require a lengthy power up time from a discharged state.

Referring still to FIG. 2, when it is time to power up PLL 200 (for example when it is time to frequency hop, etc.) a new frequency may be programmed into PLL 200. This is done by changing the ratio of the M value of divider 202 to the N value of divider 230. While the new frequency is programmed into PLL 200, a start signal is received to PLL 200 which starts the flow of power from PUI 245 back into the components of PLL 200, except for filter node 220 because the reference voltage is still being applied. During the power up sequence of PLL 200, filter node 220 is maintained by reference voltage 265 and does not receive any input from the rest of the components within PLL 200. Then, after a period of time, when the components of PLL 200 are biased to the correct power level, filter node 220 is released from reference voltage 265 and allowed to operate in conjunction with the components of PLL 200. Therefore, not only is the time for the entire power up sequence reduced (due to the maintenance of filter node 220s capacitors at a reference voltage), but no false information, possibly pulling filter node 220 in the wrong direction, is sent to filter node 220. As stated herein, filter node 220 may be constantly maintained at a reference voltage 265, or filter node 220 may instead be shorted to a reference voltage 265 just prior to power up for the other components within PLL 200.

In one embodiment, the deciding factor for when the components of PLL 200 are biased to the correct power level may be based on a previously calculated period of time. Thus, the circuits (or components) do not report that they are biased up, instead a simulation or mathematical model is used to establish the power up time of PLL 200. Trial and error can also be used to establish this period. The resulting time is then utilized in combination with reference clock 205 as a pre-programmed delay. For example, a simulation may show that PLL 200 will be biased up ten microseconds. Therefore, the outside power source (e.g., reference voltage 265) is removed from filter node 220 ten microseconds after the power up of PLL 200 begins.

Alternatively, the other components of the PLL may signal that the are stable thereby signaling the end of the waiting period.

With reference still to FIG. 2, an example of the power up time lines are shown in a timing chart. Specifically, in one embodiment, program (P) 240 signals the time given for PLL 200 to lock to a new frequency (e.g., programming the M/N ratio). The first thing that occurs is the divide by N gets programmed into the PLL. Next, PUI 245 receives a signal to power up the rest of the circuitry within the PLL. Then, power up delayed rising edge (PU-D) 265 establishes the release of filter node 220 back to the power source of PUI 240. The time frame between the initial power up (e.g., PUI 245) of the components within PLL 200 and the release of filter node 220 back to power source PUI 245 is shown by time frame 280. For example, if the programmed delay is ten microseconds then time frame 280 would be 10 microseconds in length, thereby allowing for the filter node to come up to the common mode and to the proper filter level.

Figure 3:
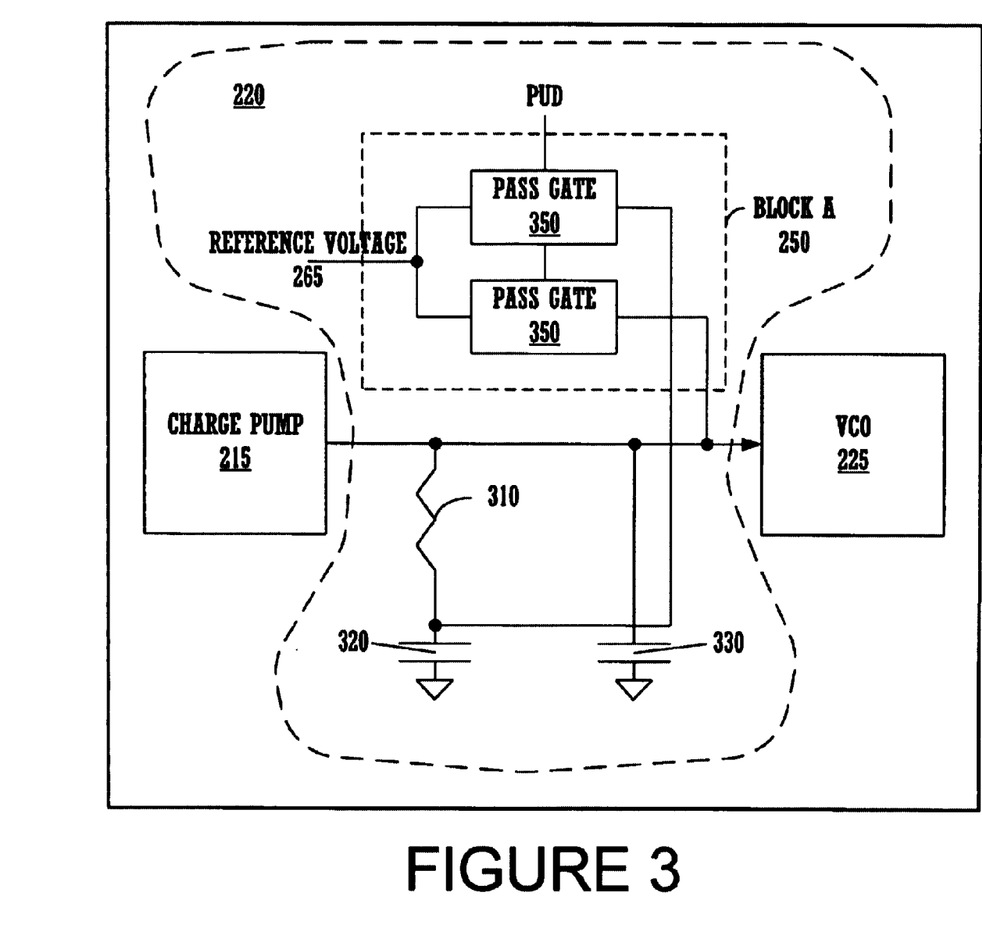
FIG. 3 is a diagram of an exemplary filter node in accordance with one embodiment of the present invention.

With reference now to FIG. 3, a diagram of an exemplary filter node is shown in accordance with one embodiment. Filter node 220 is a basic PLL filter node. Specifically, filter node 220 has resistor 310 and capacitor 320 in parallel with capacitor 330. In addition, reference voltage 265 is fed to circuit A 250 which comprises two pass gates 350. Therefore, whether the pass gates 350 are turned off or on, filter node 220 is maintained in series with charge pump 215 and VCO 225. Furthermore, when pass gates 350 are turned on filter node 220 receives the voltage from reference voltage 265. As stated herein, filter node 220 may receive the voltage from reference voltage 265 throughout the power down of the PLL or reference voltage 265 may be applied to filter node 220 just prior to the power up of the PLL circuitry depending on how the pass gates 350 are programmed.

Figure 4:
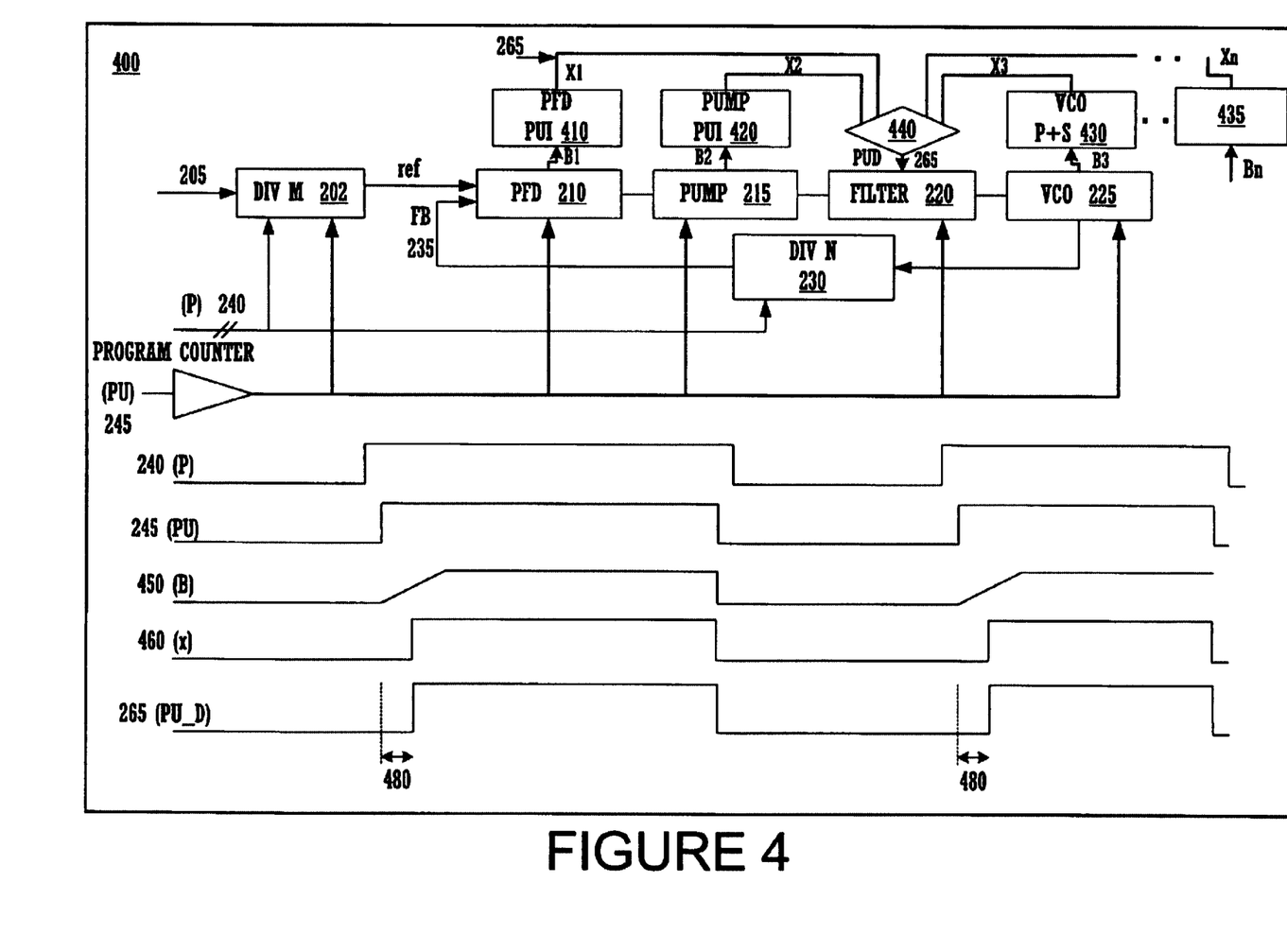
FIG. 4 is a diagram of an exemplary phase lock loop and timing chart in accordance with another embodiment of the present invention.

Referring now to FIG. 4, a diagram of an exemplary phase lock loop is shown in accordance with another embodiment. In general, the power down and power up sequences of PLL 400 of FIG. 4 are similar to that of PLL 200 of FIG. 2. However, PLL 400 has additional circuitry further establishing the bias up positions of the components within PLL 400. For example, instead of relying on a simulation to supply a predetermined delay time, PLL 400 utilizes a decision gate (e.g., logic gate 440) in conjunction with power up indicators (PUIs) (e.g., PUI 410, PUI 420, PUI 430, and PUI 435) to establish the completion of the power up process and the release of filter node 220 back to PUI 245. In this example, the components of the PLL signal that they are stable and this signal is used to end the wait period. The present invention may utilize any number or combinations of logic gates 440 that result in the release of filter node 220 after the bias up of the components of PLL 400. For example, an AND gate, or possibly one OR of two and then an AND of three. In the present description, the use of an AND gate for decision gate 440 is merely for purposes of brevity and clarity. Furthermore, although PUI indicators are shown external to the components on PLL 400 (e.g., PFD 210 and PUI 410), they may be integrated with each block (e.g., PUI 410 integrated with PFD 210).

Therefore, in one embodiment, when a component within PLL 400 is powered down, the logic gate(s) may open (or close) to allow filter 220 to receive reference voltage 265. Then, as each component within PLL 400 is biased up, a signal is sent via a power up indicator (PUI) to the logic gate (or gates). When all components are biased up, the logic gate(s) closes (or opens) to stop the flow of power from reference voltage 265.

With reference still to FIG. 4, an exemplary example of the power up time lines are shown in the timing diagram. Specifically, in one embodiment, program (P) 240 signals the time given for PLL 200 to lock to a new frequency (e.g., programming the M/N ratio). The first thing that occurs is the divide by N gets programmed into the PLL. Next, PUI 245 receives a signal to power up the rest of the circuitry within the PLL. Once PUI 245 signal is sent the whole system (e.g., PLL 400) begins to bias up. Therefore, as shown in B 450 once a bias begins, current is supplied to the current meter (e.g., PUI) and the gate voltage will slowly rise until the desired level of bias is reached. Then, X 460 triggers are utilized and set to a certain bias (e.g., operational levels). Once the bias threshold is reached the trigger is activated. Although the PUI is stated as measuring current herein, the PUI may measure bias line or other indicators (e.g., swings of one of the gates, etc.). In another embodiment, the PUIs may not only be used to deliver news to the logic gate, they may also be used to stop invalid output from coming out of the component until the component is up to power. For example, a PUI gate may allow no signal to pass until the entire PLL circuit is powered up and ready.

When all the triggers (e.g., X1 through Xn) have been activated, AND gate 440 is activated and, power up delayed rising edge (PU-D) 265 establishes the release of filter node 220 back to the power source of PUI 240. The time frame between the initial power up (e.g., PUI 245) of the components within PLL 200 and the release of filter node 220 back to power source PUI 245 is shown by time frame 480. In this embodiment, there is no need to rely on reference lock 205.

Figure 5:
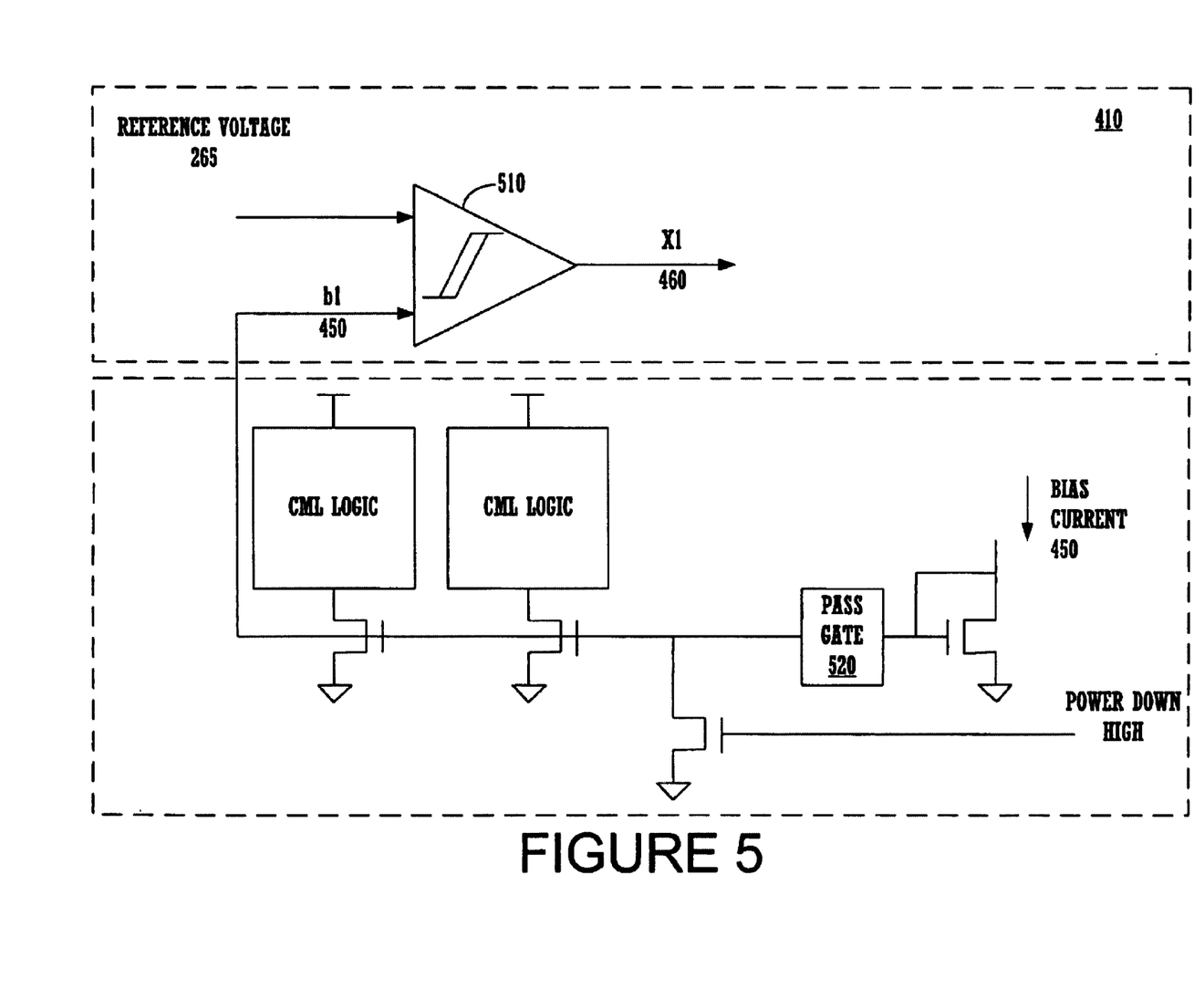
FIG. 5 is a diagram of an exemplary power up indicator in accordance with one embodiment of the present invention.

With reference now to FIG. 5, a diagram of an exemplary power up indicator is shown in accordance with one embodiment of the present invention. Specifically, there is a bias current 450 charging pass gate 520. When pass gate 520 reaches a certain level of charge (e.g., 1 volt) the X 460 gate 510 will trigger. In one embodiment, X 460 gate 510 is a comparator with hysteresis (e.g., an anti-noise switch). For example, if a hysteresis gate is set to trigger at one volt, then after the gate triggers if there is noise in the system (e.g., voltage fluctuations such as 0.9→1.1 volts) the gate will not re-trigger but will maintain its triggered state.

With reference again to FIG. 4, the use of power up indicators and logic gates allows PLL 400 self regulation. Therefore, the use of a delay and logic to maintain the delay is no longer required. Furthermore, PLL 400 may bias up even faster due to the fact that simulation delays incorporate possible "worse case" bias up situations.

Figure 6:
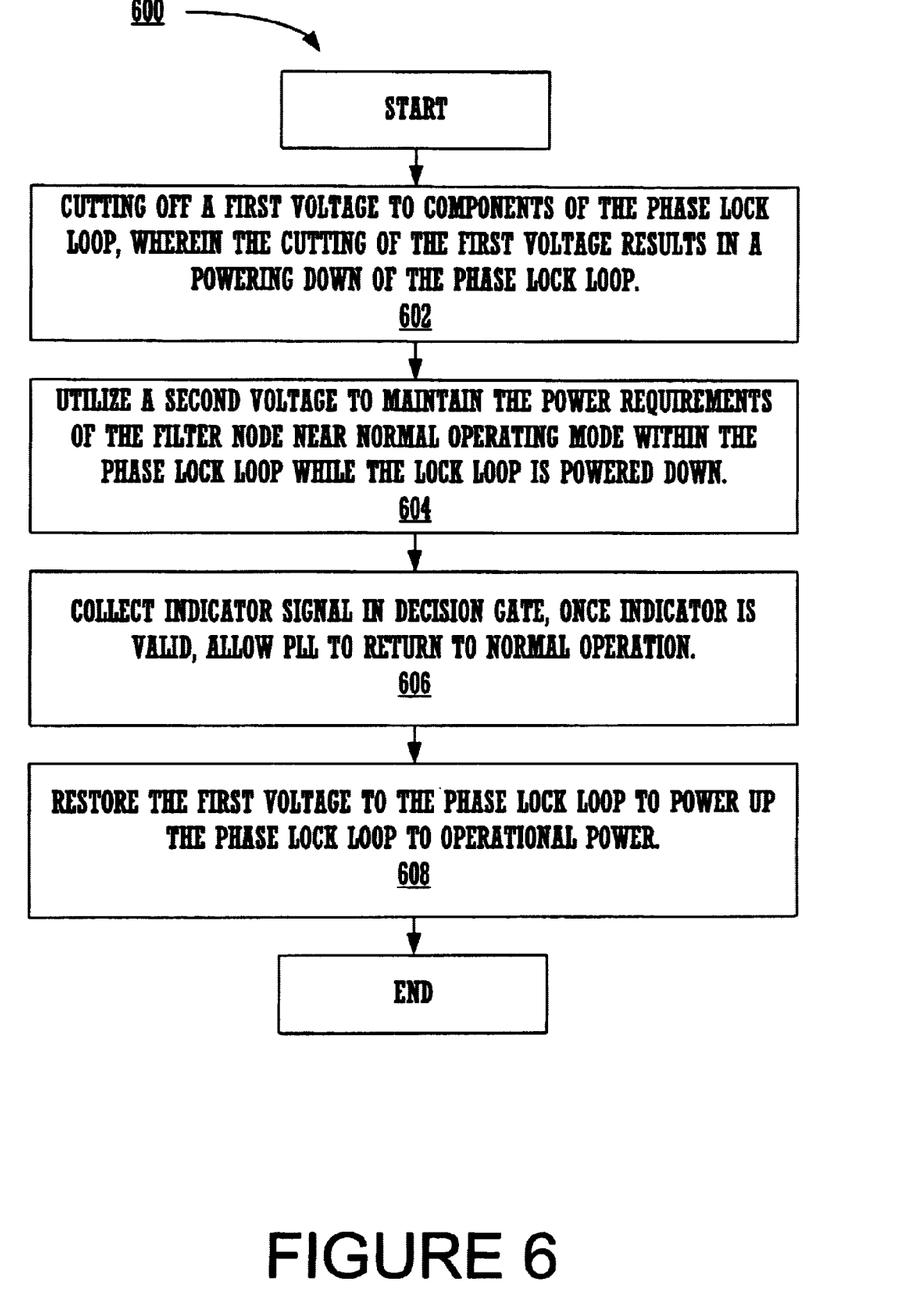
FIG. 6 is a flowchart of steps performed in accordance with an embodiment of the present invention.

With reference now to FIG. 6 and FIG. 4, a flowchart of the steps performed in accordance with an embodiment of the present invention for reducing the power up time of a phase lock loop is shown.

With reference now to step 602 of FIG. 6 and FIG. 4, in one embodiment a first voltage (e.g., PUI 245) is cut off from(or kept from) components of the phase lock loop (e.g., PLL 400) wherein the cutting off (or reduction) of the first voltage (e.g., PUI 245) results in a powering down of the phase lock loop e.g., for energy conservation. This can be done in response to a power down signal. As stated herein, the cut off (or reduction) of the first voltage is during times of non-operation after a phase lock has occurred. Therefore, the reduction of PUI 245 allows PLL 400 to reduce its power consumption during times of non-operation.

With reference now to step 604 of FIG. 6 and FIG. 4, in one embodiment a second voltage (e.g., reference voltage 265) is utilized to maintains the power requirements of filter node 220 within the phase lock loop (e.g., PLL 400) while the phase lock loop (e.g., PLL 400) is otherwise powered down. As stated herein, in one embodiment, the utilization of the second voltage during times of non-operation of PLL 400 allows filter node 220 and its capacitors to remain charged. In another embodiment, the second voltage (e.g., reference voltage 265) is applied to filter node 220 only at the end of the poser down period of PLL 400. Therefore, PLL 400 has a reduced power consumption but also maintains the slowest power up component in a semi-operational status. In one embodiment, first voltage and second voltage are received from the same power supply. In another embodiment, first voltage and second voltage have separate power supplies.

With reference now to step 606 of FIG. 6 and FIG. 4, in one embodiment indicator signals (e.g., signals from power-up indicators 410, 420, 430, and 435) are collected in a decision gate (e.g., gate 440). Once an indicator, a group of selected indicators, or all the indicators are valid (e.g., component coupled with indicator is powered up) decision gate 440 allows PLL 400 to return to normal operation. PLL 400 may be returned to normal operation to maintain a frequency to perform a frequency hop, or a combination thereof.

With reference now to step 608 of FIG. 6 and FIG. 4, in one embodiment the first voltage supply (e.g., PUI 245) is restored to the phase lock loop (e.g., PLL 400) to power up the phase lock loop (e.g., PLL 400) to operational power. As stated herein, the restoration of the first voltage supply occurs when the phase lock loop (e.g., PLL 400) receives a new phase frequency to be programmed (e.g., a frequency hop). In addition, a start signal is sent to PLL 400 initiating the power up of PLL 400. In one embodiment, the second power supply (e.g., reference voltage 265) is disengaged from filter node 220 based on a previously calculated amount of time since the restoration of the first voltage supply (e.g., PLL 200 of FIG. 2). In another embodiment (e.g., PLL 400 of FIG. 4), the second power supply (e.g., reference voltage 265) is disengaged from filter node 220 based on a power up indicator (e.g., PUI 410, 420, 430, and 435) in conjunction with a logic gate (e.g., logic gate 440).

Thus, the present invention provides, in various embodiments, methods for reducing the power up time of a phase lock loop (PLL). Embodiments of the present invention also provide a method for reducing the power up time of a PLL which can efficiently reduce power consumption of the PLL. The present invention further provides a method for reducing the power up time of a PLL which allows no information to be sent while powering up the PLL until the components within the PLL are stabilized. The present invention also provides a method for reducing the power up time of a PLL which is compatible with existing PLL processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. A phase lock loop (PLL) circuit comprising:
   a plurality of PLL components each receiving power from a first power source for supplying power; and
   a filter node of said PLL components, receiving power from a second power source for supplying power to said filter node, said second power source supplying power to said filter node during a power down period of said first power source.

2. The phase lock loop circuit of claim 1, wherein said second power source supplies power to said filter node at a reference voltage.

3. The phase lock loop circuit of claim 1 wherein during said power up period of said first power source, said filter node is cut off from said second power source and said filter node receives power from said first power source.

4. The phase lock loop circuit of claim 3 wherein during said power up period of said first power source said filter node is cut off from said second power source after a predetermined period of time has passed.

5. The phase lock loop circuit of claim 3 wherein during said power up period of said first power source said filter node is cut off from said second power source after said plurality of PLL components is biased up.

6. A method of reducing the power up time of a phase lock loop (PLL) circuit comprising:
cutting off a first voltage to components of said PLL, wherein the cutting off of said first voltage results in a powering down of said PLL;
utilizing a second voltage to maintain the power requirements of a filter node near operational mode within said PLL while said PLL is powered down; and
restoring said first voltage to said PLL to power up said PLL to operational power.

7. The method as recited in claim 6 further comprising:
programming a new frequency into said PLL.

8. The method as recited in claim 6 further comprising:
maintaining the same frequency of said PLL.

9. The method as recited in claim 8 further comprising:
sending a PLL start signal, said PLL start signal initiating a power up of at least one of the group consisting of a phase frequency detector (PFD) node, a pump node, and a voltage controlled oscillator (VCO) node within said components of said PLL.

10. The method as recited in claim 9 further comprising:
disengaging said second voltage from said filter node after said initiating of said power up of said PFD node, said pump node, said VCO node within said PLL, wherein said disengaging of said second voltage is based on a predetermined period of time.

11. The method as recited in claim 9 further comprising:
disengaging said second voltage from said filter node after said initiating of said power up of said PFD node, said pump node, said VCO node within said PLL, wherein said disengaging of said second voltage from said filter node is based on a power-up indicator.

12. The method as recited in claim 11 wherein after said component is biased up said power up indicator coupled with said component sends a signal to a decision gate.

13. The method as recited in claim 12 wherein said decision gate disengages said second voltage from said filter node after receiving said signal from said power up indicator.

14. The method as recited in claim 12 wherein said decision gate disengages said second voltage from said filter node after receiving said signal from each said power up indicator within said PLL.

15. A phase lock loop (PLL) circuit comprising:
a phase frequency detector (PFD) node for comparing a reference frequency with a feedback frequency;
a pump node for receiving a signal from said PFD node and establishing pump up and pump down signals based on said comparing;
a filter node for converting said pump up and pump down signals from said pump node to a voltage;
a voltage controlled oscillator (VCO) node for converting said voltage from said filter node into a frequency;
a divider node for receiving said frequency from said VCO node and dividing it down into said feedback frequency; and
a reference voltage for supplying power to said filter node during a portion of a PLL power down period.

16. The phase lock loop circuit of claim 15 wherein during said PLL power down at least one of the group consisting of said PFD node, said pump node, and said VCO node use no power.

17. The phase lock loop circuit of claim 15 wherein during a PLL power up period, said reference voltage is removed from said filter node.

18. The phase lock loop circuit of claim 17 wherein during said PLL power up period, said reference voltage is removed from said filter node after a predetermined period of time has passed.

19. The phase lock loop circuit of claim 17 wherein during said PLL power up period, said reference voltage is removed from said filter node after at least one of the group consisting of said PFD node, said pump node, and said VCO node is biased up to operational levels.

20. The phase lock loop circuit of claim 19 wherein a logic gate is utilized by said PLL in conjunction with a power up indicator (PUI) to establish when at least one of the group consisting of said PFD node, said pump node, and said VCO node are biased up to operational levels such that said reference voltage may be removed from said filter node.

* * * * *